(12) United States Patent
Schmult et al.

(10) Patent No.: US 12,094,964 B2
(45) Date of Patent: Sep. 17, 2024

(54) HETEROSTRUCTURE OF AN ELECTRONIC CIRCUIT HAVING A SEMICONDUCTOR DEVICE

(71) Applicants: NaMLab gGmbH, Dresden (DE); Technische Universität Dresden, Dresden (DE)

(72) Inventors: Stefan Schmult, Dresden (DE); Andre Wachowiak, Dresden (DE); Alexander Ruf, Dresden (DE)

(73) Assignees: NAMLAB GGMBH, Dresden (DE); TECHNISCHE UNIVERSITÄT DRESDEN, Dresden (DE)

( * ) Notice: Subject to any disclaimer, the term of this patent is extended or adjusted under 35 U.S.C. 154(b) by 0 days.

(21) Appl. No.: 18/332,119

(22) Filed: Jun. 9, 2023

(65) Prior Publication Data
US 2023/0327012 A1 Oct. 12, 2023

Related U.S. Application Data

(63) Continuation of application No. 16/509,022, filed on Jul. 11, 2019, now Pat. No. 11,699,749.

(30) Foreign Application Priority Data

Jul. 12, 2018 (DE) .......................... 102018005642.3
Aug. 2, 2018 (DE) .......................... 102018006173.7

(51) Int. Cl.
*H01L 29/778* (2006.01)
*H01L 29/20* (2006.01)
(Continued)

(52) U.S. Cl.
CPC ...... *H01L 29/7787* (2013.01); *H01L 29/2003* (2013.01); *H01L 29/205* (2013.01);
(Continued)

(58) Field of Classification Search
CPC ............ H01L 29/0646; H01L 29/0649; H01L 29/2003; H01L 29/201; H01L 29/205;
(Continued)

(56) References Cited

U.S. PATENT DOCUMENTS 4,734,750 A 3/1988 Okamura et al.
4,821,093 A 4/1989 Iafrate et al.
(Continued)

*Primary Examiner* — Fazli Erdem
(74) *Attorney, Agent, or Firm* — Edell, Shapiro & Finnan, LLC

(57) ABSTRACT

An electronic circuit having a semiconductor device is provided that includes a heterostructure, the heterostructure including a first layer of a compound semiconductor to which a second layer of a compound semiconductor adjoins in order to form a channel for a 2-dimensional electron gas (2DEG), wherein the 2-dimensional electron gas is not present. In aspects, an electronic circuit having a semiconductor device is provided that includes a III-V heterostructure, the III-V heterostructure including a first layer including GaN to which a second layer adjoins in order to form a channel for a 2-dimensional electron gas (2DEG), and having a purity such that the 2-dimensional electron gas is not present. It is therefore advantageous for the present electronic circuit to be enclosed such that, in operation, no (Continued)

light of wavelengths of less than 400 nm may reach the III-V heterostructure and free charge carriers may be generated by these wavelengths.

16 Claims, 10 Drawing Sheets

(51) Int. Cl.
   *H01L 29/205* (2006.01)
   *H01L 29/22* (2006.01)
   *H01L 29/225* (2006.01)
(52) U.S. Cl.
   CPC ............ *H01L 29/22* (2013.01); *H01L 29/225* (2013.01); *H01L 29/7788* (2013.01)
(58) Field of Classification Search
   CPC ..... H01L 29/22; H01L 29/225; H01L 29/408; H01L 29/42372; H01L 29/7786; H01L 29/7787; H01L 29/7788
   USPC .......................................................... 257/43
   See application file for complete search history.

(56) References Cited

U.S. PATENT DOCUMENTS

| | | |
|---|---|---|
| 5,035,479 A | 7/1991 | Vounckx |
| 9,773,896 B2 | 9/2017 | Lutgen et al. |
| 10,447,261 B1 | 10/2019 | Hughes et al. |
| 2004/0124435 A1* | 7/2004 | D'Evelyn ........... H01L 21/0254 |
| | | 257/E29.189 |
| 2007/0018198 A1* | 1/2007 | Brandes .............. H01L 29/7787 |
| | | 257/E29.253 |
| 2010/0102309 A1 | 4/2010 | Nakahara et al. |
| 2010/0270559 A1 | 10/2010 | Ota |
| 2013/0221409 A1 | 8/2013 | Nakajima et al. |
| 2015/0357454 A1 | 12/2015 | Lutgen et al. |
| 2016/0043209 A1 | 2/2016 | Oyama |
| 2017/0098719 A1 | 4/2017 | Chen |
| 2017/0200817 A1 | 7/2017 | Curatola et al. |
| 2018/0061975 A1 | 3/2018 | Tanaka |
| 2019/0280093 A1 | 9/2019 | Curatola et al. |
| 2020/0176593 A1 | 6/2020 | Derluyn |
| 2020/0328296 A1 | 10/2020 | Hwang et al. |

* cited by examiner

HETEROSTRUCTURE OF AN ELECTRONIC CIRCUIT HAVING A SEMICONDUCTOR DEVICE

CROSS REFERENCE TO RELATED APPLICATIONS

This application is a continuation of U.S. patent application Ser. No. 16/509,022 filed on Jul. 11, 2019, which claims foreign priority under 35 U.S.C. § 119(a)-(d) to Application No. DE 102018005642.3 filed on Jul. 12, 2018, and Application No. DE 102018006173.7 filed on Aug. 2, 2018, the entire contents of which are hereby incorporated by reference.

TECHNICAL FIELD

Described herein is an electronic circuit having a semiconductor device that includes a heterostructure, and a transistor. The heterostructure includes a first layer including a compound semiconductor to which a second layer adjoins in order to form a channel for a 2-dimensional electron gas, wherein the 2-dimensional electron gas is not present.

BACKGROUND

Compound semiconductors, such as gallium nitride (GaN) or zinc oxide (ZnO), with a large bandgap and, as a consequence, a high electric breakdown resistance are promising materials for applications in the field of power electronics. In combination with a high charge-carrier mobility, more compact devices may be constructed for high voltages with enhanced performance indices over silicon, the currently prevalently used semiconductor. High charge-carrier mobility is also a necessary core parameter for high transconductance and cutoff frequency of transistors in high-frequency applications. In contrast to the silicon technology for field-effect transistors which mainly uses inverted local doping between switching channel regions, e.g., p-type doping, and terminal zones (n-type doping), in the case of III-V semiconductor compounds, such as gallium nitride, the conductivity of a buried two-dimensional electron gas (2DEG) of high charge-carrier mobility at a heterostructure junction can be modulated or switched using the field effect of a gate.

For GaN, very common for this purpose is a heterojunction of aluminum gallium nitride 102 and gallium nitride 101 (AlGaN/GaN)(FIG. 1), with the confinement potential for charge carriers, in particular electrons, and thus for the 2DEG being located on the GaN side close to the GaN/AlGaN interface. This heterostructure is usually grown onto a buffer layer 103 disposed on a substrate 100, for example of GaN, AlGaN, silicon carbide (SiC), sapphire or silicon.

However, this has disadvantageously resulted in the 2DEG being formed across a large surface area and—according to reports so far—being inherently filled with electrons.

C. G. Van de Walle describes surface states as a source of excess charge carriers (C. G. Van de Walle et al., Journal of Applied Physics 101, 081704, 2007) that populate the confinement potential at the GaN/AlGaN interface (GaN/AlGaN heterojunction) and thus may inherently form a 2DEG as a conductive channel. In this context, special mention must be made of the role of the confinement potential. Such confinement potential is formed due to polarization discontinuities at heterojunctions along polar crystal directions; however, by definition, it need not be populated with charge carriers and therefore does not inherently constitute a conductive channel. Similar behavior is known from zinc oxide/magnesium zinc oxide (ZnO/MgZnO) (J. Falson et al., REPORTS ON PROGRESS IN PHYSICS 81 (5), 056501, 2018) or from strontium titanate/lanthane aluminate (SrTiO/LaAlO) (A. Ohtomo et al., NATURE 427 (6973) 423-426, 2004) heterostructures.

Therefore depletion of the channel is only possible through additional electric fields. Without an electrical field or other structural interventions in the heterostructure formed, the channel will be always electrically conducting, which entails substantial disadvantages for fail-safe operation applications. This is shown in FIG. 1 by two electrical contacts 105 and a circuit comprising a voltage source 130 and a current measuring unit 120. A current flows through the 2DEG independently of the polarity of the voltage source and its value, and independently of whether the circuit is exposed to light radiation or is disposed in a light-shielding package 180.

Therefore, if the 2DEG has formed at the AlGaN/GaN heterojunction, High Electron Mobility Transistor (HEMT) devices with a Schottky configuration for a gate or with an additional dielectric layer between the gate and the AlGaN barrier have a negative threshold voltage, i.e., less than 0V, and exhibit normally-on behavior, i.e., the transistor is switched ON at 0V gate voltage. Normally-off devices, however, are easier to control in terms of circuitry and perform fail-safe operation in the event of a failure of the control electronics in the power electronics equipment, which is why normally-off behavior of devices is desirable.

Various solutions have been realized for implementing "normally-off" HEMT devices on a GaN basis with a positive threshold voltage, i.e., >0V. All of the solutions described below involve additional complexity and possibly considerable cost.

Growing a p-type doped (Al)GaN layer onto the AlGaN barrier results in a band development in which the confinement potential of the 2DEGs is raised above the Fermi level and thus the 2DEG is completely depopulated (Y. Uemoto et al. in IEEE Trans. El. Dev., vol. 54, no 12, p. 3393 (2007)). The additional p-type (Al)GaN layer is only present beneath the gate and is removed from the supply line regions between the ohmic contacts and the gate, such that the 2DEG is still present in these regions. Several embodiments exist of this solution, e.g., those including partial removal of the AlGaN barrier by back etching, in order to further increase the threshold voltage.

Another approach for normally-off devices is based on complete or nearly complete removal of the AlGaN barrier beneath the gate by etching and insertion of an isolator layer or a dielectric for the purpose of reducing leakage currents of the gate. However, the channel region beneath the gate will then no longer exhibit the extremely high charge-carrier mobility of a buried semiconductor heterojunction. As the channel forms in the GaN at the interface with the dielectric, increased interface scattering and scattering at charged impurities occur thereby lowering the mobility of the charge carriers. This in turn disadvantageously lowers the transconductance and the maximum current carrying capacity of the devices or raises the starting resistance.

The 2DEG may also be depopulated by introducing fixed negative charges into the heterostructure beneath the gate, e.g., in the form of implanting fluorine ions or of a fluorine plasma process. However, the threshold voltages achieved will not have very high values (<1V), and for higher densities of fluorine ions introduced, the charge-carrier mobility will be decreased and instabilities of the threshold voltage will occur. This approach is also used in combination with an etch-back of the AlGaN barrier.

In power electronics, a compromise solution in terms of the circuitry is utilized for high voltages. By combining a normally-off transistor device, e.g., in a silicon technology, and a normally-on AlGaN/GaN HEMT in a cascade circuit, a composite device having normally-off behavior is constructed. The source terminal of the normally-on device is connected to the gate of the normally-on device. The threshold voltage of the cascade circuit is determined by the threshold voltage of the normally-off silicon transistor and can therefore be set sufficiently high (>3V), while the high-voltage resistance is ensured by the normally-on GaN device. The starting resistance of the cascade circuit is given by the series connection of the low-voltage Si transistor and the high-voltage GaN transistor and is higher than that of the GaN transistor alone. Therefore this approach, which is of higher complexity, is utilized predominantly in the field of high voltage class devices. Currently there are also attempts to implement the cascade circuit in a monolithic GaN technology.

SUMMARY

An object underlying the described device is to provide an electronic circuit having a semiconductor device and an improved heterostructure which exhibits normally-off behavior and overcomes the drawbacks described above.

An object of the described device is solved by the features of a semiconductor device that includes a heterostructure including a first layer and a second layer that together form a channel for a 2-dimensional electron gas (2DEG), wherein the first layer comprises a compound semiconductor to which the second layer adjoins, and wherein the channel, in the absence of an external field, is substantially free of electrons from a 2-dimensional electron gas; that is, the 2-dimensional electron gas is not present.

Therefore, an aspect of the described device relates to a heterostructure that forms a confinement potential which is not inherently populated with charge carriers (normally-off).

According to the object defined, an aspect of the described device comprises an electronic circuit having a semiconductor device that includes a heterostructure, the heterostructure including a layer of a compound semiconductor to which a second layer adjoins which is advantageously also implemented as a compound semiconductor in order to form a channel for a 2-dimensional electron gas (2DEG), wherein the 2-dimensional electron gas is not present (FIG. 2a.)

Forming a channel for a 2-dimensional electron gas (2DEG), wherein the 2-dimensional electron gas is not present, means that, without an external field, the confinement potential at the interface of the layer to which a second layer adjoins is above the Fermi energy EF (chemical potential) and is not populated with electrons, such that no 2DEG is present. Hence the channel is not conducting, as there are no free charge carriers present. An electrically conducting channel is present only when the confinement potential is populated with charge carriers.

According to the object defined, an aspect of the described device comprises an electronic circuit having a semiconductor device that includes a III-V heterostructure on buffer layer/structure (203) disposed onto a carrier (200), the III-V heterostructure including a first layer 201 including GaN to which a second layer 202 adjoins in order to form a channel 208 for a 2-dimensional electron gas (2DEG), wherein the 2-dimensional electron gas is not present (FIG. 2a).

Therefore, an aspect of the described device in particular relates to an electronic circuit having a semiconductor device that includes a III-V heterostructure, the III-V heterostructure including a layer including GaN to which a second layer adjoins in order to form a channel for a 2-dimensional electron gas (2DEG), such that the 2-dimensional electron gas is not present.

Forming a channel for a 2-dimensional electron gas (2DEG), wherein the 2-dimensional electron gas is not present, means that, without an external field, the confinement potential at the interface of the GaN layer to which a second layer adjoins is above the Fermi energy EF and is not populated by electrons, such that no 2DEG is present. To this end, the III-V heterostructure is specifically formed such that the layer which includes GaN to which a second layer adjoins in order to form a channel for a 2-dimensional electron gas (2DEG), has a purity, such that the 2-dimensional electron gas is not present.

In particular, purity as referenced in the application is a measure for the number of free electrons present that contribute to conductivity by being confined in the confinement potential formed by the polarization discontinuities at heterojunctions of the GaN interface along the polar crystal directions. According to an aspect of the described device, the number per volume of the free electrons in the first layer that become confined in the confinement potential may be less than $10^{17}$ cm$^{-3}$.

In particular, purity as referenced in the application is a measure for the number of foreign atoms, i.e., atoms not intended to form the first or second layer of the heterostructure, that are contained in the layers. One embodiment of the described device provides for fewer than $1 \times 10^{17}$ cm$^{-3}$ oxygen atoms being contained in the first layer. Another embodiment provides for fewer than $1 \times 10^{17}$ cm$^{-3}$ foreign atoms being contained in the first layer.

The realization relates to an electronic circuit having a semiconductor device that includes a III-V heterostructure, the III-V heterostructure including a layer including GaN to which a second layer adjoins in order to form a channel for a 2-dimensional electron gas (2DEG), wherein the 2-dimensional electron gas is not present. This realization is particularly advantageous as it causes the channel to be always electrically non-conducting in the absence of an electrical field or any other structural changes to the heterostructure formed, which results in significant advantages for fail-safe operation applications.

According to the object defined, an aspect of the described device comprises an electronic circuit having a semiconductor device that includes a II-VI heterostructure, the II-VI heterostructure including a first layer including ZnO to which a second layer adjoins in order to form a channel for a 2-dimensional electron gas (2DEG), wherein the 2-dimensional electron gas is not present.

Therefore, an aspect of the described device in particular also relates to an electronic circuit having a semiconductor device that includes a II-VI heterostructure, the II-VI heterostructure including a first layer including ZnO to which a second layer adjoins in order to form a channel for a 2-dimensional electron gas (2DEG), and having a purity such that the 2-dimensional electron gas is not present.

Therefore the described device in particular also relates to an electronic circuit having a semiconductor device that includes a II-VI heterostructure, the II-VI heterostructure including a first layer including ZnO to which a second layer adjoins in order to form a channel for a 2-dimensional electron gas (2DEG), and having so few oxygen defects such that the 2-dimensional electron gas is not present.

BRIEF DESCRIPTION OF THE DRAWINGS

Aspects of the described device are discussed in further detail below with reference to exemplary embodiments. In the drawings.

DETAILED DESCRIPTION

The following explanations regarding a III-V heterostructure are also applicable to II-VI heterostructures using appropriate technical metrics.

Figure 1:
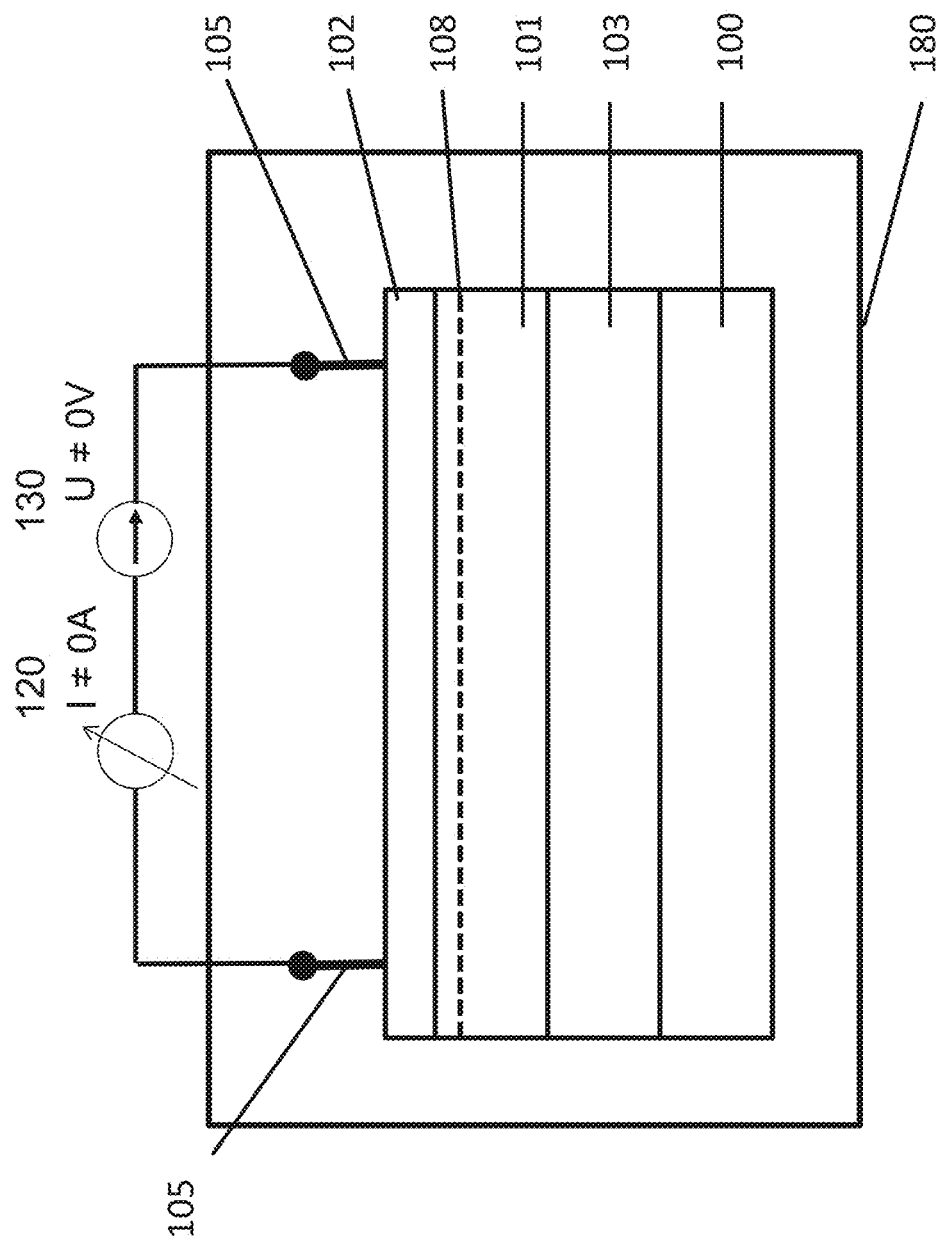
FIG. 1 shows: A diagram of a III-V heterostructure including a first layer including GaN to which a second layer adjoins in order to form a channel for a 2-dimensional electron gas (2DEG), wherein in the prior art the 2-dimensional electron gas is present even in the absence of light. When applying a voltage U unequal to 0 V (130) to the two contacts (105), the ammeter I (120) indicates a current flow.
Figure 2A:
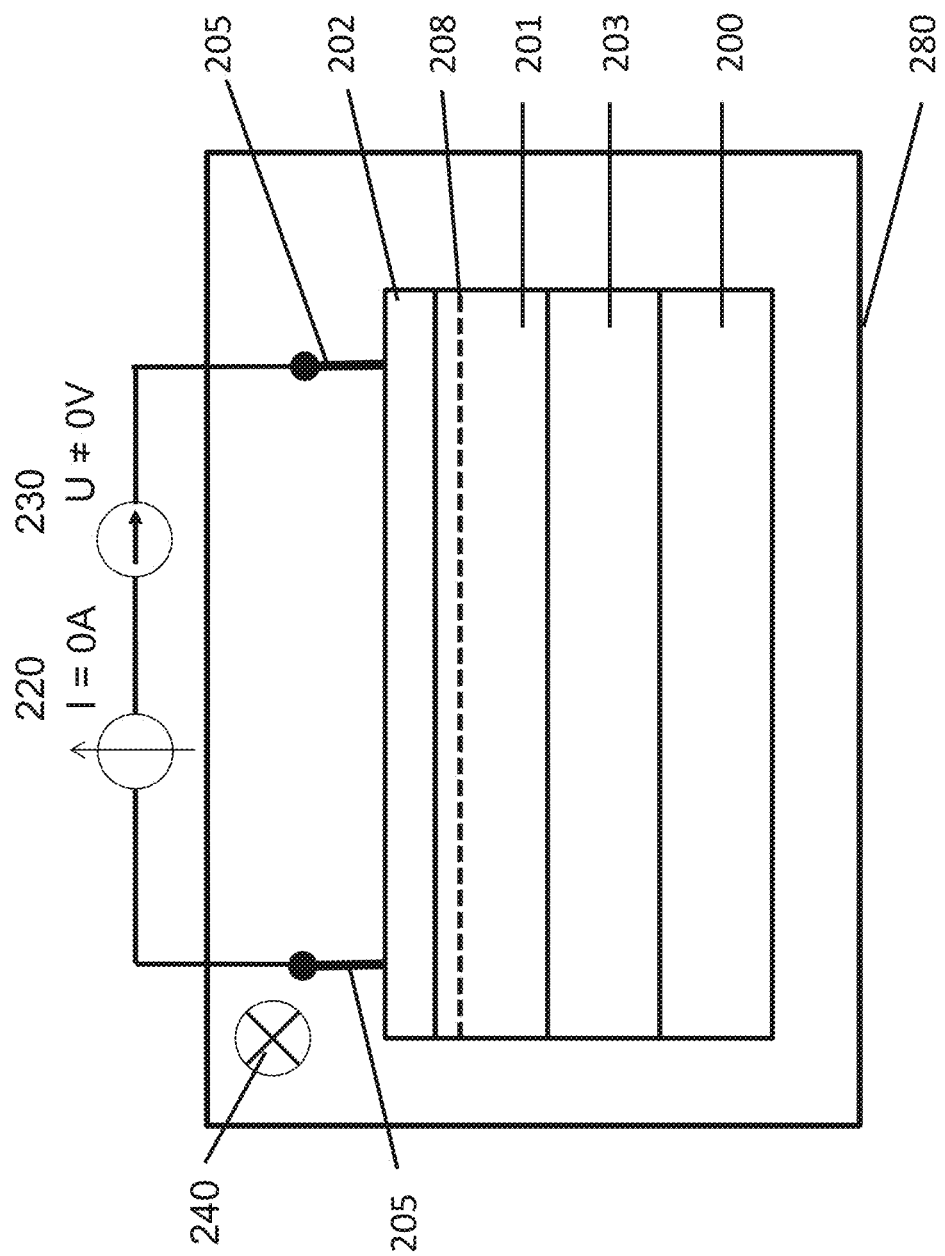
FIG. 2a shows: A diagram of a III-V heterostructure including a first layer including GaN to which a second layer adjoins in order to form a channel for a 2-dimensional electron gas (2DEG), wherein in particular the 2-dimensional electron gas is not even present when the light source/electromagnetic wave irradiation source (240) is switched off. When applying a voltage U unequal to 0 V (230) to the two contacts (205), the ammeter I (220) does not indicate any current flow.
Figure 2B:
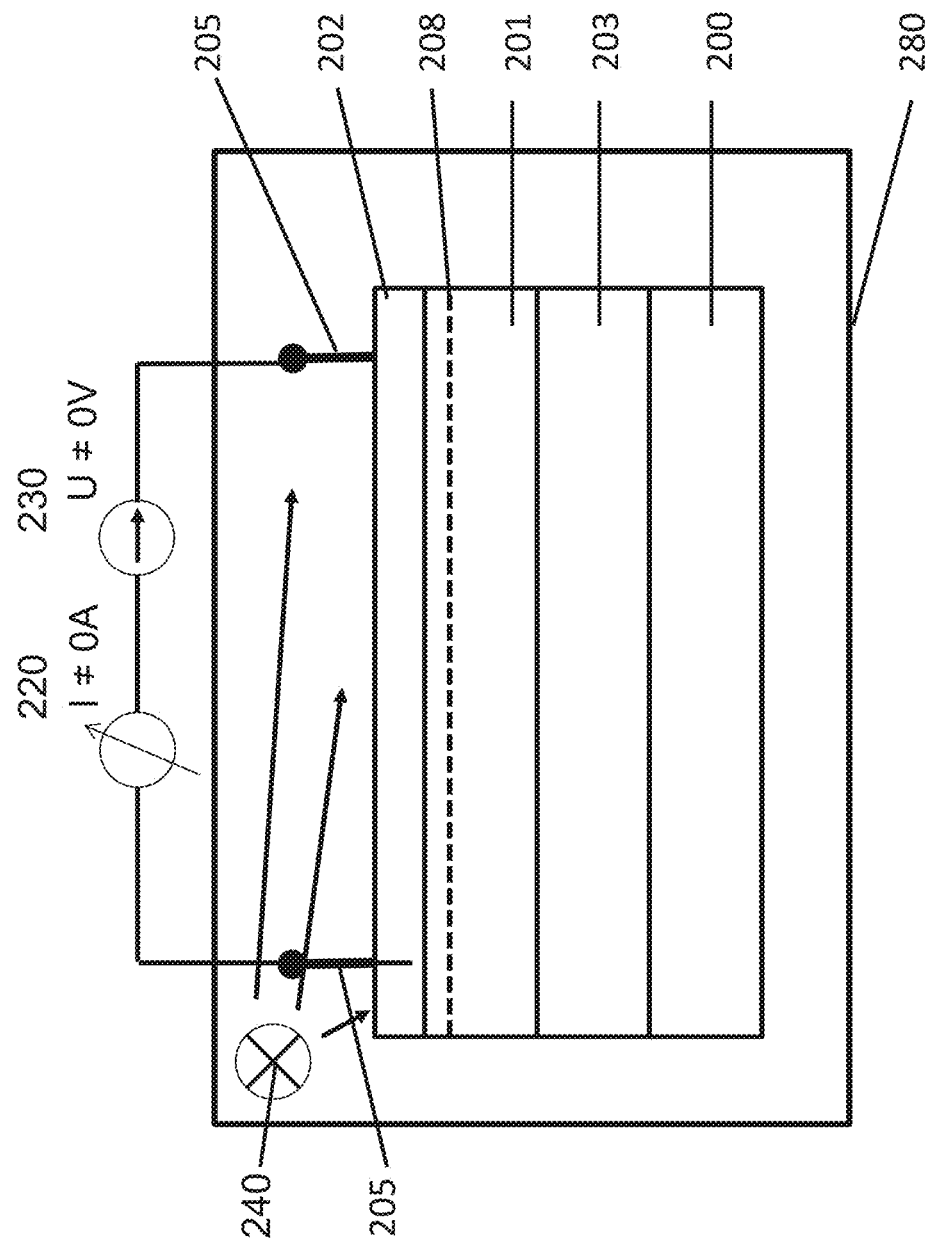
FIG. 2b shows: A diagram of a III-V heterostructure including a first layer including GaN to which a second layer adjoins in order to form a channel for a 2-dimensional electron gas (2DEG), wherein the 2-dimensional electron gas is present when the light source/electromagnetic wave irradiation source (240) is switched on. When applying a voltage U unequal to 0 V (230) to the two contacts (205), the ammeter I (220) indicates a current flow.

Due to the band diagram of certain III-V heterostructures and of GaN in particular, and due to the direct bandgap present in GaN between the valence and the conductance bands, it is indeed always possible to generate free electrons that become confined at heterojunctions of the GaN interface along the polar crystal directions in the confinement potential formed. As a result, a 2DEG may form at light irradiation/electromagnetic wave irradiation (FIG. 2b).

It is therefore advantageous for the present electronic circuit to be enclosed such that, in operation, no light/electromagnetic wave irradiation of wavelengths can reach the III-V heterostructure, such that free charge carriers may be generated by these wavelengths. As the bandgap between the valence band and the conductance band is large in comparison with other semiconductor materials such as GaAs, for example, it is advantageous if specifically no light/electromagnetic wave irradiation of a wavelength of less than 400 nm is able to reach the III-V heterostructure. For this purpose, opaque packages made of black polymers, which are commonly used in the microelectronics industry, may be used. Other embodiments are possible too, e.g., enclosing the electronic circuit in a separate housing. There are electronic applications, however, that may utilize precisely this effect of the channel forming a 2DEG under light irradiation/electromagnetic wave irradiation and becoming conducting. In such cases, the embodiments provide for either a transparent package or a transparent window for allowing light irradiation/electromagnetic wave irradiation.

Figure 4:
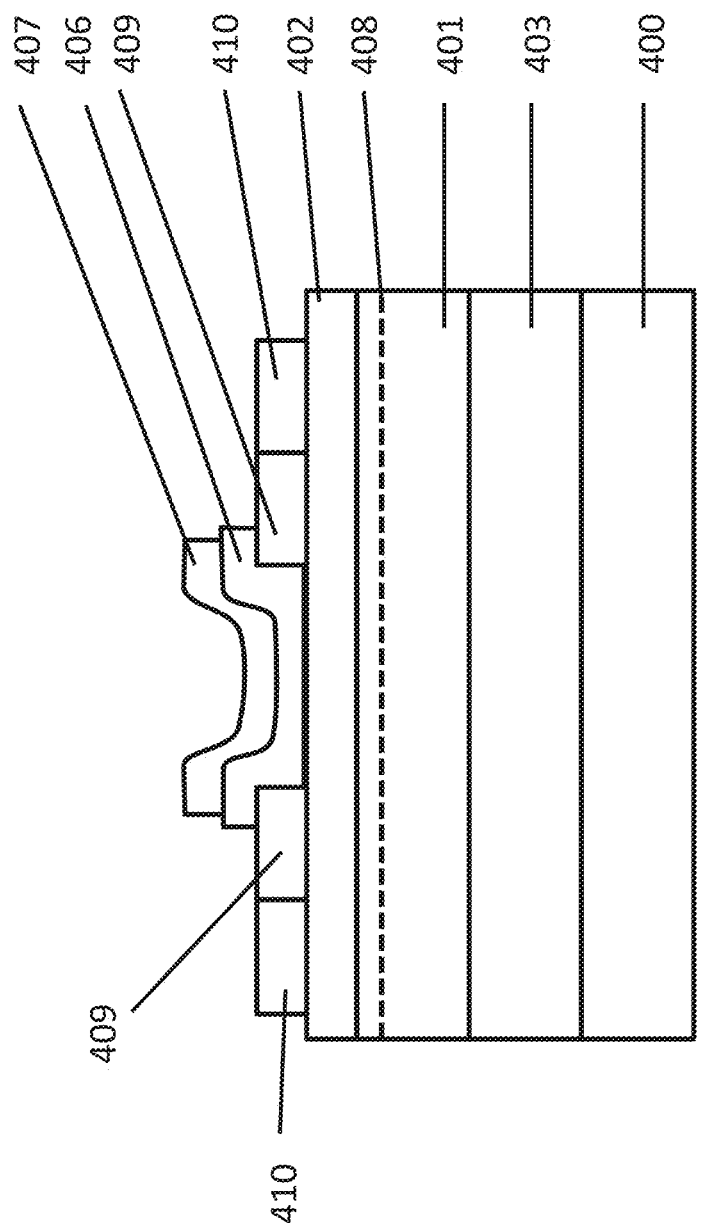
FIG. 4 shows: An embodiment for a normally-off transistor according to the described device, wherein the gate (407) is configured only across a certain section between the electrical contacts (410). An isolating layer (406) is disposed beneath the gate and the second layer of the heterostructure (402). The heterostructure (401, 402) forming the channel (408) positioned on a buffer layer/structure (403) which is disposed onto a carrier (400). In the supply line area between the electrical contacts and the gate, an isolating layer (409) is realized adjoining to the upper end of the heterostructure which contains positive charges within the layer or at the interface with the heterostructure.

Embodiments of the electronic circuit having a semiconductor device that includes the previously described advantageous III-V heterostructure use the semiconductor device as an electronic switch (transistor) (FIG. 4). To this end, an additional electrical potential is formed between the channel formed and the interface of the second layer which does not adjoin to the first layer. This additional electrical potential may be modified by applying and varying an external voltage, such that a 2DEG is formed in the channel and the channel can be depopulated again. Advantageous embodiments provide for the 2DEG to be formed in the channel when applying an electrical potential of more than 1 V.

In the implementation of the semiconductor device, two contacts and an isolating layer are implemented adjoining to the two semiconducting layers of the III-V heterostructure, such that the isolating layer extends partially across one of the two contacts.

The second layer as referenced in the application then constitutes a barrier for charge carriers, such that a confinement potential is formed along the polar crystal directions due to the polarization discontinuities at the heterojunction of the GaN interface. In order for this confinement potential to be formed, another trivalent element can be incorporated into the crystal lattice instead of gallium, such that a ternary compound of the chemical formula $Ga_xK_{1-x}N$ and with K as a placeholder for such a trivalent element. Aluminum is particularly suitable as such an element. In one embodiment the gallium content is 94% and the aluminum content is 6%.

In other embodiments of the electronic circuit, the first layer of the III-V heterostructure may also comprise aluminum or indium as the trivalent element.

In the context of the embodiments of the electronic circuit mentioned, the thickness of the first layer in the heterostructure may be limited to a thickness of less than 100 nm. It is advantageous if this first layer has a dislocation defect density of less than $10^7$ $cm^{-2}$. In other embodiments, another contact is implemented adjoining to the isolating layer that partially extends across one of the two contacts, separated by the isolating layer.

Figure 3:
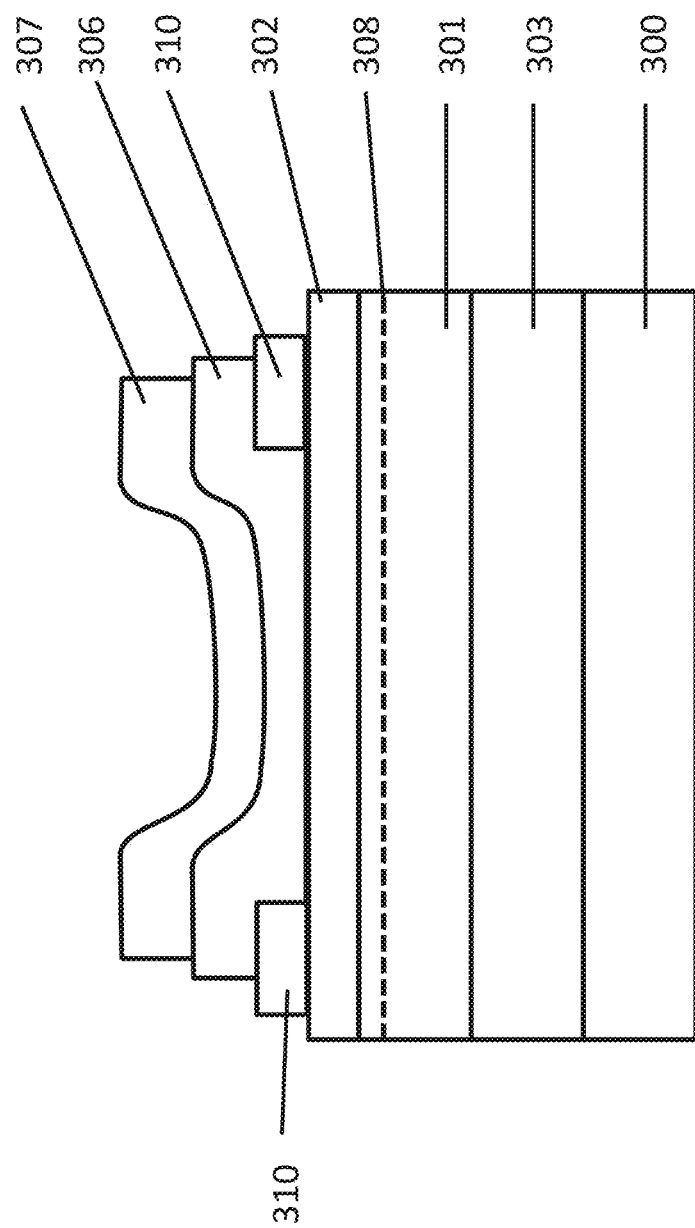
FIG. 3 shows: An embodiment of a transistor according to the described device exhibiting normally-off behavior having the described heterostructure (302,301) and two electrical contacts (310). An isolating layer (306) is disposed on the second layer of the heterostructure that extends at least partially beyond the electrical contacts. Across the isolating layer, in turn, an electrically conducting layer (307) is disposed that partially extends across the two electrical contacts, separated by the isolating layer.

One embodiment of the described device provides for the background impurities to be reduced to a level that leads to isolating GaN or AlGaN, by means of the growth conditions of the GaN/AlGaN heterostructures in a molecular beam epitaxy system. At the interface of the GaN/AlGaN heterostructure, a channel may be realized that has the confinement potential described and no 2DEG in the absence of light irradiation/electromagnetic wave irradiation. The advantageous heterostructure is grown at 700° C. and has the chemical formula $GaN/Al^{0.06}Ga_{0.94}N/GaN$ with layer thicknesses of 1 µm/16 nm/3 nm. For gallium, a starting material with impurities of less than 100 ppb (parts per billion) is evaporated and nitrogen was made available as a gas with impurities of less than 100 ppb. The growth takes place in a vacuum chamber at $<10^{-10}$ mbar base pressure and $<10^{-5}$ mbar process pressure. The combination of the selected materials with unintentional background impurities of less than $10^{17}$ $cm^{-3}$, grown onto an electrically isolating GaN substrate with a dislocation defect density of less than $10^7$ $cm^{-2}$, yields a heterostructure that becomes conductive only under the influence of light/electromagnetic wave irradiation or by applying a gate voltage >0 V (FIG. 3). According to the exemplary embodiment, the GaN substrate may be synthesized by means of ammonothermal crystal growth and may have a thickness of 653 µm. The electrically isolating character is specified by an electrical resistance of >1 GigaOhm*cm. Without any light irradiation/electromagnetic wave irradiation and without additional electrical fields, the confinement potential is thus not populated with charge carriers, and transistors made thereof exhibit normally-off behavior. A comparable structure with a nominally identical order of layers but having background impurities of more than $10^{17}$ $cm^{-3}$, grown onto a substrate with a dislocation defect density of $2 \times 10^9$ $cm^{-2}$, results in devices that exhibit normally-on behavior.

Generally, in all embodiments of the heterostructure a further finishing layer of a chemical composition corresponding to that of the first layer may be applied onto the second layer with the function of a barrier. For example, this finishing layer may be GaN again, on a barrier of AlGaN.

The GaN-substrate may also generally be of a different thickness and may be implemented by means of other known manufacturing methods. The isolating property can be achieved both by avoiding impurities and by suitable counterdoping in case of the doping or impurity being known.

One embodiment of a transistor having normally-off behavior is shown in FIG. 3 and includes the described heterostructure (301, 302) with two electrical contacts (310). Beneath the heterostructure (301, 302), a buffer layer/structure (303) is disposed that is applied onto a carrier (300). Silicon, sapphire or silicon carbide are commonly used as materials for the carrier. The buffer layer may comprise aluminum nitride and gallium nitride. Layer systems that include layers of silicon nitride may also be used. The requirements for the buffer layer with regard to conductivity are identical to the previously described requirements for the GaN substrate. In the exemplary embodiment described, the buffer layer should be isolating. On the second layer of the heterostructure (302), an isolating layer (306) is disposed that extends at least partially beyond the electrical contacts. Across the isolating layer, in turn, an electrically conducting layer (307) is disposed, that partially extends across the two electrical contacts, separated by the isolating layer. The electrically conducting layer forms a gate for the channel area (308) of the confinement potential. By applying a positive voltage to the gate opposite the potential of the substrate stack and the source contact, the confinement potential is pulled below the Fermi level in terms of energy and is therefore filled with electrons, thereby forming the 2DEG. In the present embodiment and in the following, the term substrate stack refers to the substrate/carrier (300) and the buffer layer (303). In case of an additional positive potential difference between the drain contact and the source contact, a current flow occurs between these contacts and the transistor is in the ON state. If no potential difference is present between the gate and the substrate stack, the confinement potential is above the Fermi level in terms of energy and no 2DEG is present, which is why the transistor is in the OFF state and no detectable current flow occurs.

The described configuration of the transistor may also be implemented in such a manner (not shown here) that the isolating layer between the gate and the second semiconducting layer is present only in the region of overlap between the gate and the electrical contacts. In this case, the conducting layer (307) directly adjoins the second layer of the heterostructure (302). To this end, the second layer of the heterostructure may be implemented as a single layer or as a double layer or even as a multilayer.

The electrically isolating functionality achieved by the isolating layer (306) between the electrical contacts (310) and the conducting layer that is formed as the gate may similarly be realized at least partially by an air-bridge or air or vacuum inclusions. In the latter case, the isolating layer would be implemented as a porous layer.

Another embodiment of a normally-off transistor which corresponds to FIG. 4 provides for the gate (407) to be configured only across a certain section between the electrical contacts (410). Beneath the gate and the second layer of the heterostructure, an isolating layer (406) may be disposed. One advantageous embodiment is implemented even without the isolating layer (406). In the supply line region between the electrical contacts and the gate, an isolating layer (409) is implemented adjoining to the upper end of the heterostructure which includes positive charges within the layer or at an interface with the heterostructure. In one embodiment, the layer may comprise or contain silicon oxide. The positive charges or rather the electrical fields resulting therefrom cause the confinement potential to be below the Fermi level in terms of energy and therefore the 2DEG in the supply line regions to be populated. To this end, the isolating layer having positive charges may also be constructed from a combination of different layers. The positive charges may likewise be implemented by a layer of dipoles having a positive charge that is oriented towards the confinement potential. This transistor configuration is suitable for applications in the power electronics field. The normally-off behavior or the positive threshold voltage of the transistor is determined by the configuration beneath the gate. On the other hand, in the OFF state of the transistor, i.e., at 0 V gate potential opposite the source and the substrate stack, high positive voltages may be applied to the drain without a breakdown of the transistor occurring. The possible block voltage of the transistor varies depending, among other things, on the distance between the source and the gate.

Figure 5:
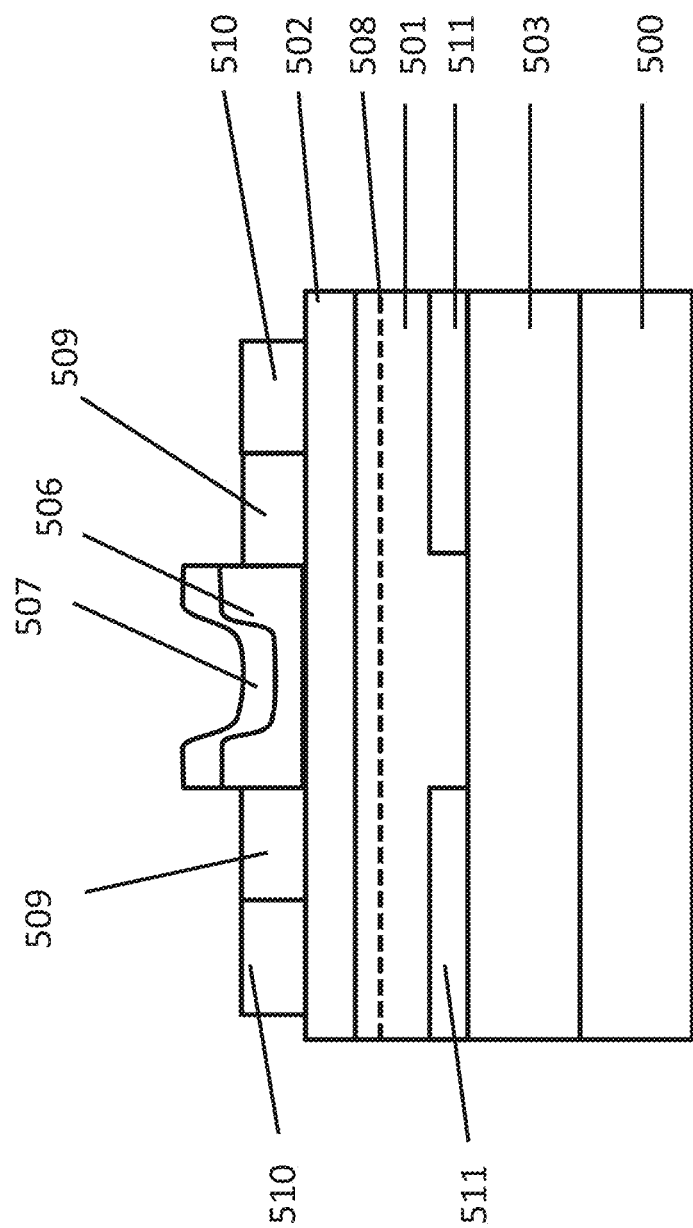
FIG. 5 shows: An embodiment of a normally-off transistor according to an aspect of the described device, wherein the gate (507) is configured only across a certain section between the electrical contacts (510). Beneath the contacts (510) and the isolating layer (509), an isolating layer (511) is disposed between the heterostructure (501, 502) forming a channel 508 region for a 2-dimensional electron gas and the substrate stack (500, 503) which contains positive charges within the layer or at the interface with the heterostructure.

Another embodiment of a normally-off transistor which corresponds to FIG. 5 provides for and includes the described heterostructure (501,502) having two electrical contacts (510). On the second layer of the heterostructure (502), an isolating layer (506) may be disposed. There are also advantageous embodiments where such an isolating layer (506) may be omitted (not shown). The gate (507) is implemented across the isolating layer (506). In embodiments without the isolating layer, the gate is implemented directly across the second layer of the heterostructure. Between each of the two electrical contacts (510) and the gate, an isolating layer is implemented (509) that electrically isolates the electrical contacts (510) from the gate (507). Between the first layer of the heterostructure (501) and the substrate stack (500, 503), in the region beneath the electrical contacts (510) and the isolating layer (506), an isolating layer is implemented (511) that includes positive charges within the layer or at the interface with the heterostructure. The positive charges or rather the electrical fields resulting therefrom cause the confinement potential to be below the Fermi level in terms of energy and therefore the 2DEG in the supply line regions to be populated. The isolating layer may comprise or contain silicon oxide. To this end, the isolating layer having positive charges may also be constructed from a combination of different layers. A well-known combination of materials is a layer of silicon oxide and a layer of aluminum oxide. The positive charges may likewise be implemented by a layer of dipoles having a positive charge that is oriented towards the confinement potential. Another exemplary embodiment comprises a positively doped layer of gallium nitride and an isolating layer of AlGaN.

In order to realize the exemplary embodiment described, the isolating layer (511) may first be implemented on a large surface area on the buffer layer. In those regions across which the gate is subsequently to be implemented or that are intended to realize an electrical separation between the gates, the isolating layer is removed following a respective lithographic step. Then the heterostructure is grown to a large surface area.

In a specific embodiment (not drawn), the isolating layer (511) may also be integrated in or implemented as part of the buffer layer (503).

Figure 6:
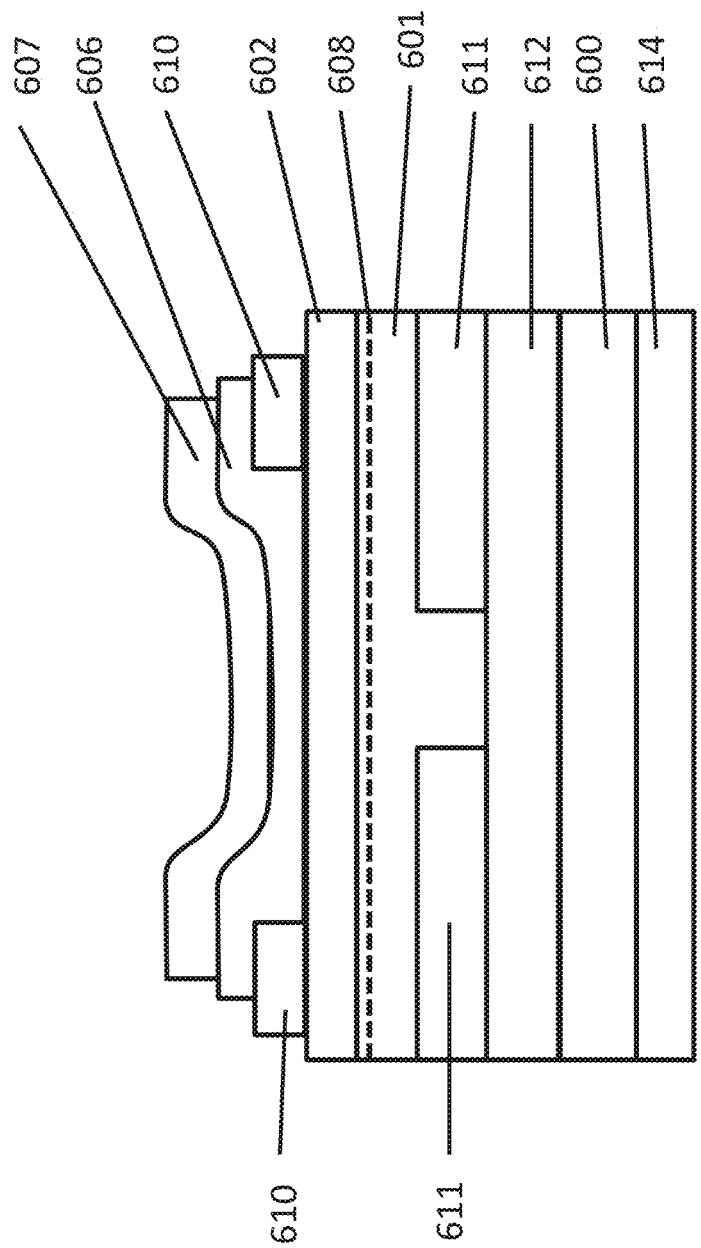
FIG. 6 shows: An embodiment corresponding to the heterostructure (601, 602) forming a channel 608 region for a 2-dimensional electron gas described in an aspect of the described device in a vertical transistor with electron conduction from the top side to the bottom side of a conductive substrate (600).

Another embodiment according to FIG. 6 includes a heterostructure (601, 602) described in accordance with the described device in a vertical transistor having electron conductance from the top side to the bottom side of a conductive substrate (600). The drain (614) is implemented on the flipside of a conductive substrate (600). The heterostructure described is applied onto a current aperture that has been pre-patterned in the substrate stacks and comprises a low n-type doped GaN layer (612) and a laterally patterned layer/blocking layer that blocks electron conductance (611). The blocking layer may be an amorphous GaN layer, a p-type doped GaN layer or an isolating layer, for example. On the top side of the heterostructure, the electrical source (610), the isolating layer (606) and the gate (607) are applied. In the depicted version, two source regions are disposed laterally relative to the gate. The implementation of the electrical source region and the gate is depicted in accordance with the lateral transistor variant of FIG. 3, but may also be implemented in accordance with FIG. 4.

Due to the heterostructure as implemented according to aspects of the described device, the vertical transistor exhibits normally-off behavior too. At 0 V voltage at the gate, the confinement potential of the channel (608) is not populated with electrons and no current flow occurs between the top side and the bottom side. High positive voltages may be applied to the flipside contact in the OFF state, thereby establishing a wide depletion zone in the low doped layer opposite the blocking layer in order to accommodate the electrical field without the field rising above a critical breakout field strength. Also, the buried blocking layer (611) prevents electrons from carrying a current flow directly from the upper contact to the lower contact. For positive voltages at the gate, the 2DEG is populated and electrons may pass from the source via the 2DEG and through the orifice or aperture of the current aperture between the blocking layer to the flipside contact, such that the transistor is in the ON state. With a conventional heterostructure, the transistor described will have normally-on behavior, which is disadvantageous for fail-safe operation applications.

Figure 7B:
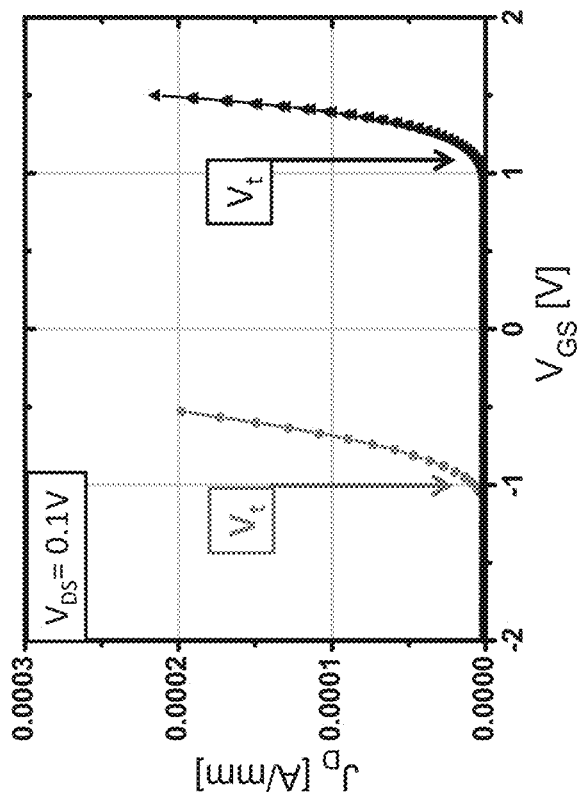
FIG. 7b shows: Transfer characteristics measured at light irradiation (solid gray line with solid circular measuring points) and in darkness (solid black line with solid triangular measuring points) of a transistor of the embodiment shown in FIG. 3. The drain current density $J_D$ is plotted on a linear scale, based on the gate width of the transistor, against the gate-source voltage $V_{GS}$. The drain-source voltage $V_{DS}$ is 0.1 V.
Figure 7A:
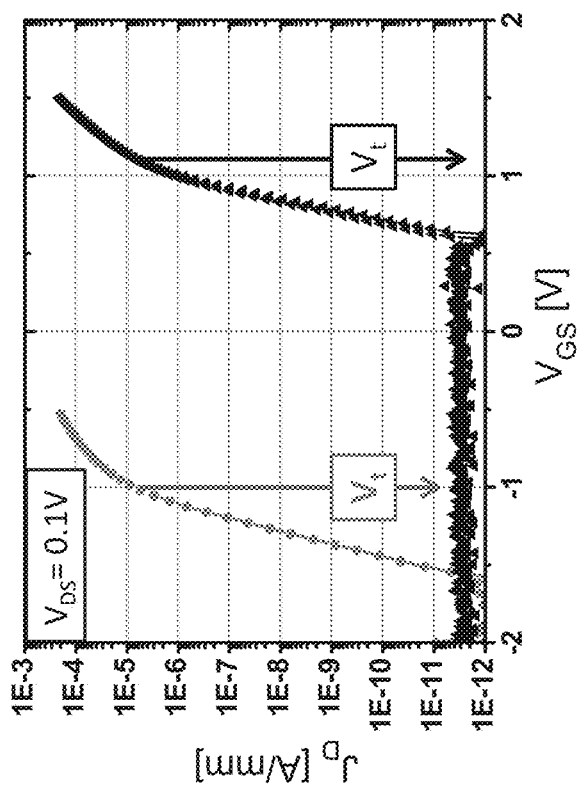
FIG. 7a shows: Transfer characteristics measured at light irradiation (solid gray line with solid circular measuring points) and in darkness (solid black line with solid triangular measuring points) of a transistor of the embodiment shown in FIG. 3. The drain current density $J_D$ is plotted on an logarithmic scale, based on the gate width of the transistor, against the gate-source voltage $V_{GS}$. The drain-source voltage $V_{DS}$ is 0.1 V.

FIGS. 7a, 7b shows measured transfer characteristics of a transistor of the embodiment shown in FIG. 3. The drain current density $J_D$, based on the gate width of the transistor, is plotted against the gate-source voltage $V_{GS}$. The drain-source voltage $V_{DS}$ is 0.1 V. The transistor has a gate width of 150 μm and a gate length between the electrical contacts of 30 μm. As opposed to FIG. 3, it has an additional 3 nm GaN finishing layer on top of the 16 nm $Al^{0.06}Ga_{0.94}N$ barrier. The isolating layer comprises a 24 nm aluminum oxide layer.

Under exclusion of light, in darkness, the transfer characteristic (solid black line with solid triangular measuring points) shows a positive threshold voltage $V_t$ of approx. +1 V. The threshold voltage corresponds to the gate voltage necessary to cause the population of the 2DEG to start and a significant current flow to occur. Under light irradiation (solid gray line with solid circular measuring points), the transistor has a threshold voltage in the negative voltage range of approx. −1 V, i.e., at 0 V gate voltage $V_{GS}$, the 2DEG is formed under light irradiation, i.e., an electrically conducting channel is present, and a negative voltage $V_{GS}$ of the gate is needed to deplete the compound semiconductor of electrons and to switch off the transistor.

In FIG. 7b, the transfer characteristics are shown in a linear representation of the drain current density $J_D$, illustrating the threshold voltage $V_t$ at the boundary between the separated areas of the ON and OFF states of the transistor.

Figure 8B:
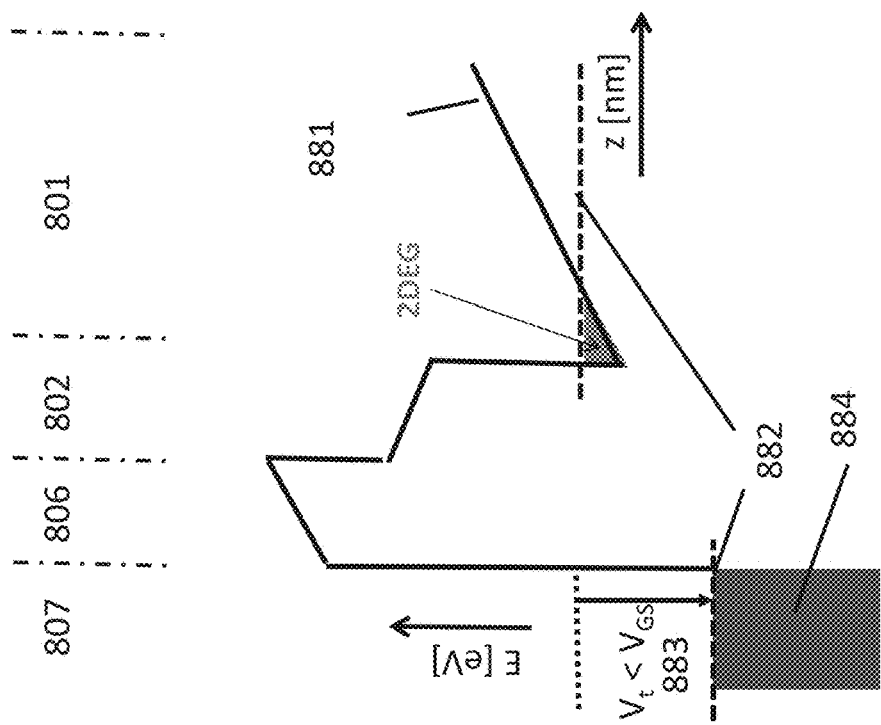
FIG. 8b shows: A diagram of the development of the conduction band lower edge $E_L$(881) from the metallic gate perpendicularly into the heterostructure, for the gate-source voltage $V_{GS}$>0V (883), schematically for the case of darkness, i.e. without light irradiation. The space coordinate z represents the direction perpendicular to the 2DEG surface area or the gate surface area.
Figure 8A:
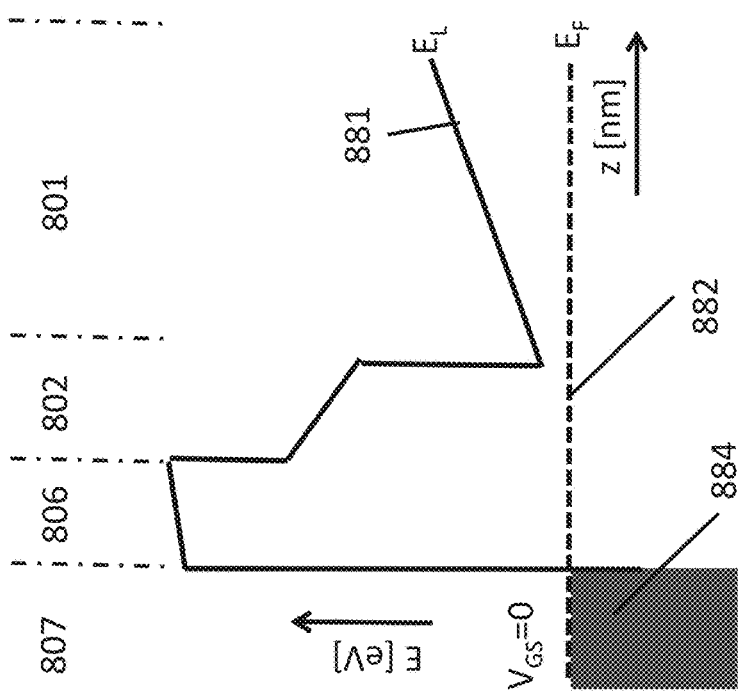
FIG. 8a shows: A diagram of the development of the conduction band lower edge $E_L$(881) from the metallic gate perpendicularly into the heterostructure, for the gate-source voltage $V_{GS}$=0V, schematically for the case of darkness, i.e., without light irradiation. The space coordinate z represents the direction perpendicular to the 2DEG surface area or the gate surface area.

In FIGS. 8a and 8b, the energy-related development of the conduction band lower edge EL (881) from the metallic (884) gate (807), separated from the AlGaN barrier (802) by an isolating layer (806), perpendicularly into the heterostructure is schematically shown for the two gate-source voltages $V_{GS}$=0 V and $V_{GS}$>$V_t$ in the case of darkness, i.e., without light irradiation, in particular without light irradiation at a wavelength of less than 400 nm. Here, the space coordinate z represents the direction perpendicular to the 2DEG surface area or the gate (807) surface area. For the sake of clarity, the thin GaN finishing layer is not plotted as well, which does not significantly alter the fundamental development. For 0 V gate-source voltage $V_{GS}$ (FIG. 8a), the confinement potential at the interface of the GaN layer (801) with the AlGaN barrier (802) is above the Fermi energy $E_F$ (882) and is not populated with electrons, such that no 2DEG is present. For a positive gate-source voltage $V_{GS}$ (883) (FIG. 8b) above the threshold voltage $V_t$, the lower edge of the conduction band $E_L$ (881) of the confinement potential is below the Fermi energy $E_F$, which is why the latter is filled with electrons and a 2DEG is formed. Upon formation of the 2DEG, the conductivity of the channel and the current flow, respectively, between the electrical contacts increases for a given drain-source voltage.

Figure 9B:
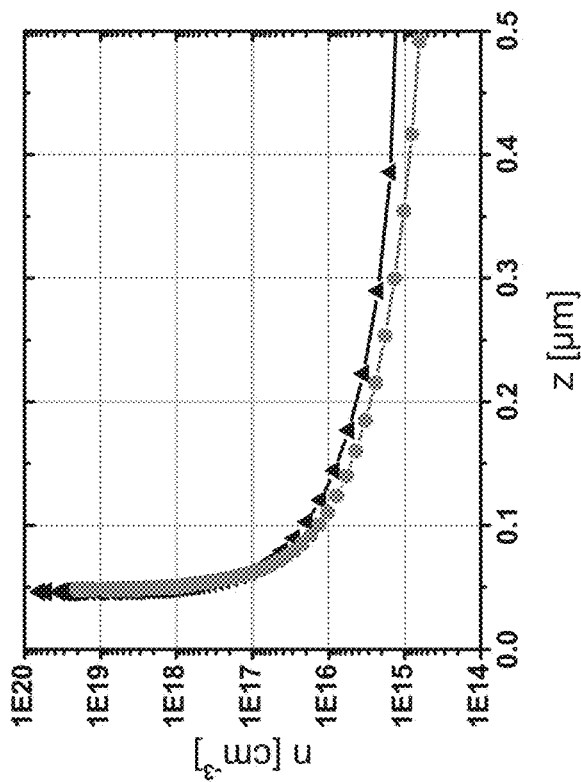
FIG. 9b shows: A diagram of the free charge carrier mobility n determined as a function of the distance from the gate from the voltage-dependent capacitance measurement values (less the offset capacitance) between the gate and the heterostructure under light incidence (solid gray line with solid round measuring points) and without light incidence (solid black line with solid square measuring points). The scale of the x axis, with z as the space coordinate, indicates the distance perpendicular to the 2DEG surface area in relation to the bottom edge of the gate.
Figure 9A:
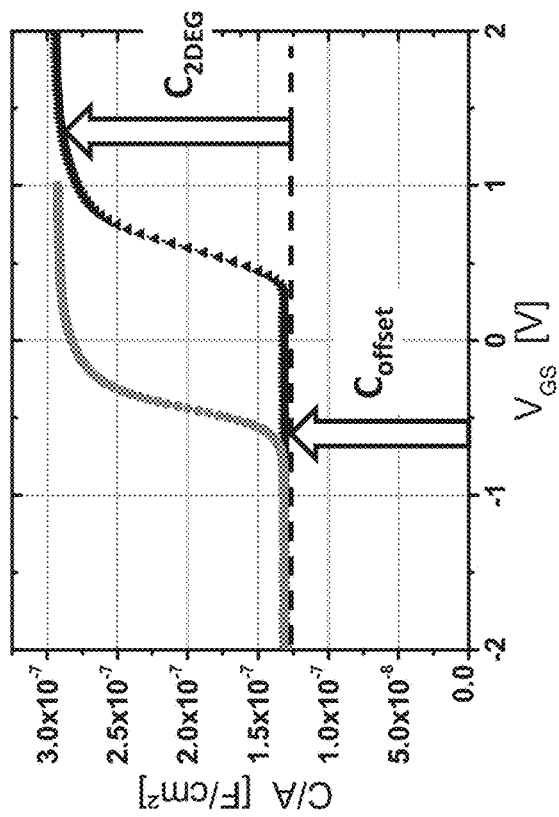
FIG. 9a shows: A diagram of the measured capacitance C/A, i.e., of the area capacitance based on the gate electrode surface area across the heterostructure, for a transistor having the inventive heterostructure, plotted against the voltage $V_{GS}$ applied between the gate and the electrical contacts (source and drain) in darkness (solid black line with solid circular measuring points) and under light incidence (solid gray line with solid triangular measuring points).

In FIG. 9a, the measured capacitance C/A, i.e., the area capacitance, based on the gate electrode surface area across the heterostructure, is shown plotted against the voltage $V_G$S applied between the gate and the electrical contacts (source and drain). The measured capacitance is composed of a voltage-dependent component from the gate to the heterostructure $C_{2DEG}$ and of a voltage-independent parallel capacitance $C_{offset}$ from the projection of the gate across the electrical electrodes. The parasitic overlap capacitance $C_{offset}$ can be considered as an offset.

For the case of darkness, i.e., without light irradiation, in particular without light irradiation of a wavelength of less than 400 nm, (solid black line with solid circular measuring points), the capacitance of the gate toward the heterostructure $C_{2DEG}$ (measured capacitance C/A less the offset capacitance $C_{offset}$) at 0 V shows a negligible value and then an increase to a characteristic plateau for positive gate voltages. The capacitance of the plateau corresponds to the serial capacitance of the AlGaN barrier (16 nm), the GaN finishing layer (3 nm) and the isolating layer ($Al_2O_3$ 24 nm). In the voltage-dependent capacitance measurement, reaching the plateau tallies well with the threshold voltage of the transistor in darkness (see FIG. 7). The measured capacitance C/A in the plateau area between the gate and the heterostructure thus proves the modulation of the electron density in the 2DEG in this voltage range. When the 2DEG is depopulated, the serial capacitance between the gate and the heterostructure additionally includes a very small serial component via the GaN channel layer and possibly deeper layers, which is why the total capacitance becomes infinitesimally low.

Under light incidence, i.e., in particular under light irradiation with a wavelength of less than 400 nm, (solid gray line with solid triangular measuring points), the same plateau value is reached in the voltage-dependent measurement, in this case, however, already upon an increase in the negative voltage range after exceeding the threshold voltage $V_{GS}$, which in this case is negative. This means that under the light incidence chosen, the 2DEG is populated at 0V and that negative gate-source voltages $V_t$ are needed to depopulate the 2DEG.

The location of the increase in the voltage-dependent capacitance measurements and the threshold voltage of the transistor, respectively, under light incidence is dependent on the light intensity and the wavelength range of the light source.

From the voltage-dependent capacitance measurement values (less the offset capacitance) between the gate and the heterostructure, the free charge carrier density n may be determined as a function of the distance from the gate, as shown in FIG. 9b. The scale of the x axis with z as the space coordinate indicates the distance perpendicular to the 2DEG surface and the lower edge of the gate, respectively, i.e., the value can be directly associated with the distance of the lower edge of the gate, as AlGaN, GaN and $Al_2O_3$ have a comparable permittivity of 9. The maximum distance of approx. 45 nm shows the 2DEG at the heterojunction, then, as the depth into the GaN channel layer increases, the charge-carrier density n rapidly decreases to a nearly constant value. The graphs of the charge-carrier density under light incidence (solid black line with solid square measuring points) and without light incidence (solid gray line with solid circular measuring points) do not differ, as the voltage-dependent capacitance measurements show comparable developments and merely differ in a shift on the voltage axis.

What is claimed is:

1. An electronic circuit having a semiconductor device that comprises:
   a heterostructure including a first layer and a second layer that together form a channel, wherein:
   the first layer comprises a compound semiconductor to which the second layer adjoins,
   the heterostructure is a III-V heterostructure,
   the first layer includes fewer than $1\times10^{17}$ $cm^{-3}$ unintentional background impurities, and
   the heterostructure is grown on a substrate with a dislocation defect density of less than $1\times10^7$ $cm^{-2}$.

2. The electronic circuit according to claim 1, wherein the heterostructure includes GaN.

3. The electronic circuit according to claim 1, wherein the substrate includes GaN.

4. The electronic circuit according to claim 1, wherein the semiconductor device includes a buffer layer which adjoins to the heterostructure.

5. The electronic circuit according to claim 1, wherein the first layer has a thickness less than 100 nm.

6. The electronic circuit according to claim 1, wherein the first layer has a dislocation defect density of less than $1\times10^7$ $cm^2$.

7. The electronic circuit according to claim 1, such that a 2-dimensional electron gas is formed in the channel when an electrical potential is applied.

8. The electronic circuit according to claim 1, wherein the channel, in the absence of an external field, is substantially free of electrons from a 2-dimensional electron gas such that the entire channel is non-conducting.

9. An electronic circuit having a semiconductor device that comprises:
　a heterostructure including a first layer and a second layer that together form a channel, wherein:
　the first layer comprises a compound semiconductor to which the second layer adjoins,
　the heterostructure is a III-V heterostructure,
　the first layer includes fewer than $1\times10^{17}$ cm$^{-3}$ oxygen atoms, and
　the heterostructure is grown on a substrate with a dislocation defect density of less than $1\times10^7$ cm$^{-2}$.

10. The electronic circuit according to claim 9, wherein the heterostructure includes GaN.

11. The electronic circuit according to claim 9, wherein the substrate includes GaN.

12. The electronic circuit according to claim 9, wherein the semiconductor device includes a buffer layer which adjoins to the heterostructure.

13. The electronic circuit according to claim 9, wherein the first layer has a thickness less than 100 nm.

14. The electronic circuit according to claim 9, wherein the first layer has a dislocation defect density of less than $1\times10^7$ cm$^{-2}$.

15. The electronic circuit according to claim 9, such that a 2-dimensional electron gas is formed in the channel when an electrical potential is applied.

16. The electronic circuit according to claim 9, wherein the channel, in the absence of an external field, is substantially free of electrons from a 2-dimensional electron gas such that the entire channel is non-conducting.

* * * * *